(12) United States Patent
Glass et al.

(10) Patent No.: US 12,084,758 B2
(45) Date of Patent: Sep. 10, 2024

(54) METHOD OF MAKING GRAPHENE STRUCTURES AND DEVICES

(71) Applicant: PARAGRAF LIMITED, Somersham (GB)

(72) Inventors: Hugh Glass, Somersham (GB); Ivor Guiney, Somersham (GB); Martin Tyler, Somersham (GB); Robert Wallis, Somersham (GB); Rosie Baines, Somersham (GB); Simon Thomas, Somersham (GB)

(73) Assignee: Paragraf Limited, Somersham (GB)

( * ) Notice: Subject to any disclaimer, the term of this patent is extended or adjusted under 35 U.S.C. 154(b) by 410 days.

(21) Appl. No.: 17/625,016

(22) PCT Filed: Jul. 7, 2020

(86) PCT No.: PCT/EP2020/069082
§ 371 (c)(1),
(2) Date: Jan. 5, 2022

(87) PCT Pub. No.: WO2021/008937
PCT Pub. Date: Jan. 21, 2021

(65) Prior Publication Data
US 2022/0267896 A1    Aug. 25, 2022

(30) Foreign Application Priority Data
Jul. 16, 2019  (GB) ..................................... 1910189

(51) Int. Cl.
*C01B 32/186*     (2017.01)
*B23K 26/402*    (2014.01)
(Continued)

(52) U.S. Cl.
CPC ............ *C23C 16/26* (2013.01); *B23K 26/402* (2013.01); *C23C 16/46* (2013.01); *C23C 16/56* (2013.01);
(Continued)

(58) Field of Classification Search
CPC ........ C23C 16/26; C23C 16/46; B23K 26/402
See application file for complete search history.

(56) References Cited

U.S. PATENT DOCUMENTS 11,472,708 B2 * 10/2022 Thomas .................. C30B 25/18
11,545,558 B2 *  1/2023 Badcock ............... H01L 21/042
(Continued)

FOREIGN PATENT DOCUMENTS

CN      104023993 B  *  4/2017  ............. B32B 15/20
CN      111587221 A  *  8/2020  ........... C01B 32/184
(Continued)

OTHER PUBLICATIONS

International Search Report and Written Opinion, PCT/EP2020/069082, dated Oct. 6, 2020, 16 pages.
(Continued)

*Primary Examiner* — Laura M Menz
(74) *Attorney, Agent, or Firm* — Stinson LLP

(57) ABSTRACT

The present invention provides a method for the production of an electronic device, the method comprising: (i) providing a substrate comprising first and second layers on a heated susceptor in a reaction chamber, the chamber having a plurality of cooled inlets arranged so that, in use, the inlets are distributed across the substrate and have a constant separation from the substrate, (ii) supplying a flow comprising a precursor compound through the inlets and into the reaction chamber to thereby decompose the precursor compound and form a graphene layer structure on a surface of the first layer of the substrate, wherein the inlets are cooled
(Continued)

to less than 100° C. and the susceptor is heated to a temperature of at least 50° C. in excess of a decomposition temperature of the precursor, (iii) selectively laser ablating the graphene to expose one or more portions of the surface of the first layer of the substrate, and (iv) selectively laser ablating the surface of the first layer of the substrate to expose one or more portions of the second layer of the substrate, wherein the first layer is an electrically conductive layer and the second layer is an electrically insulative layer, or wherein the second layer is an electrically conductive layer and the first layer is an electrically insulative layer.

20 Claims, 2 Drawing Sheets

(51) Int. Cl.
  *C23C 16/26*      (2006.01)
  *C23C 16/46*      (2006.01)
  *C23C 16/56*      (2006.01)
  *G01R 33/00*      (2006.01)
  *G01R 33/07*      (2006.01)
  *B23K 101/40*     (2006.01)
(52) U.S. Cl.
  CPC ......... *G01R 33/0052* (2013.01); *G01R 33/07* (2013.01); *B23K 2101/40* (2018.08)

(56) References Cited

U.S. PATENT DOCUMENTS

| | | | | |
|---|---|---|---|---|
| 11,643,719 | B2 * | 5/2023 | Thomas | ................ C23C 16/455 427/249.6 |
| 2010/0200839 | A1 | 8/2010 | Okai et al. | |
| 2018/0364513 | A1 * | 12/2018 | Wang | ................ G02F 1/134309 |
| 2020/0361775 | A1 * | 11/2020 | Thomas | ................ C01B 32/186 |
| 2020/0373464 | A1 * | 11/2020 | Thomas | ................ C30B 25/02 |
| 2020/0403068 | A1 * | 12/2020 | Thomas | ............ H01L 21/02205 |
| 2021/0079521 | A1 * | 3/2021 | Thomas | ................ C30B 25/10 |
| 2022/0093852 | A1 * | 3/2022 | Wallis | ................ H01L 21/0257 |
| 2022/0102525 | A1 * | 3/2022 | Badcock | ................ H01L 29/78 |
| 2022/0267896 | A1 * | 8/2022 | Glass | ................ C01B 32/184 |
| 2022/0290296 | A1 * | 9/2022 | Glass | ................ C23C 16/56 |
| 2023/0098791 | A1 * | 3/2023 | Badcock | ............... H01L 21/042 257/192 |
| 2024/0040937 | A1 * | 2/2024 | Baines | ................ H10N 52/01 |
| 2024/0130248 | A1 * | 4/2024 | Glass | ................ G01R 33/072 |

FOREIGN PATENT DOCUMENTS

| | | | | | |
|---|---|---|---|---|---|
| CN | 114174222 | A | * | 3/2022 | ........... C01B 32/182 |
| DE | 112020003405 | T5 | * | 3/2022 | ........... C01B 32/182 |
| DE | 112021006520 | T5 | * | 11/2023 | ............. G01R 33/07 |
| DE | 112022001099 | T5 | * | 1/2024 | ........... C01B 32/182 |
| EP | 3737642 | A1 | * | 11/2020 | ........... C01B 32/184 |
| EP | 3737643 | A1 | * | 11/2020 | ........... C01B 32/186 |
| GB | 2570124 | A | * | 7/2019 | ........... C01B 32/184 |
| GB | 2570126 | A | * | 7/2019 | ........... C01B 32/186 |
| GB | 2570128 | A | * | 7/2019 | ........... C01B 32/182 |
| GB | 2571248 | A | * | 8/2019 | ........... C01B 32/184 |
| GB | 2585842 | A | * | 1/2021 | ........... B23K 26/402 |
| GB | 2599173 | A | * | 3/2022 | ......... H01L 21/0243 |
| GB | 2585842 | B | * | 4/2022 | ........... B23K 26/402 |
| GB | 2570124 | B | * | 6/2022 | ........... C01B 32/184 |
| GB | 2602174 | A | * | 6/2022 | ............. G01R 33/07 |
| JP | 7117395 | B2 | * | 8/2022 | ........... C01B 32/184 |
| TW | 202106619 | A | * | 2/2021 | ........... C01B 32/182 |
| TW | 202108502 | A | * | 3/2021 | ........... B23K 26/402 |
| WO | 2017029470 | A1 | | 2/2017 | |
| WO | WO-2019138229 | A1 | * | 7/2019 | ........... C01B 32/186 |
| WO | WO-2019138230 | A1 | * | 7/2019 | ........... C01B 32/184 |
| WO | WO-2019138231 | A1 | * | 7/2019 | ........... C01B 32/184 |
| WO | WO-2019138232 | A1 | * | 7/2019 | ........... C01B 32/184 |
| WO | WO-2021008937 | A1 | * | 1/2021 | ........... B23K 26/402 |
| WO | WO-2021008938 | A1 | * | 1/2021 | ........... C01B 32/182 |
| WO | WO-2022129570 | A1 | * | 6/2022 | ............. G01R 33/07 |
| WO | WO-2022129606 | A1 | * | 6/2022 | ............. G01R 33/07 |
| WO | WO-2022200351 | A1 | * | 9/2022 | ........... C01B 32/186 |

OTHER PUBLICATIONS

Great Britain Search Report, Application No. GB1910189.8, dated Jan. 10, 2020, 6 pages.

Dong et al., "Evaluating femtosecond laser ablation of graphene on SiO2/Si substrate", Journal of Laser Applications, 2016, vol. 28, No. 2, 6 pages.

Sahin et al., "Nanoscale patterning of graphene through femtosecond laser ablation", Applied Physics Letters, 2014, vol. 104, 4 pages.

Mackenzie et al., "Fabrication of CVD graphene-based devices via laser ablation for wafer-scale characterization", 2D Materials, vol. 2, No. 4, 6 pages.

* cited by examiner

METHOD OF MAKING GRAPHENE STRUCTURES AND DEVICES

REFERENCE TO RELATED APPLICATIONS

This application is the 371 U.S. national stage application of International Patent Application No. PCT/EP2020/069082, filed Jul. 7, 2020, which claims the benefit of Great Britain Patent Application No. 1910189.8, filed Jul. 16, 2019, the entire disclosures of which are incorporated herein by reference.

The present invention relates to a method for making an electronic device comprising a graphene layer structure.

Graphene is a well-known material with a plethora of proposed applications driven by the material's theoretical extraordinary properties. Good examples of such properties and applications are detailed in 'The Rise of Graphene' by A. K. Geim and K. S. Novoselev, Nature Materials, vol. 6, March 2007, 183-191.

WO 2017/029470, the content of which is incorporated herein by reference, discloses methods for producing two-dimensional materials. Specifically, WO 2017/029470 discloses a method of producing two-dimensional materials such as graphene, comprising heating a substrate held within a reaction chamber to a temperature that is within a decomposition range of a precursor, and that allows graphene formation from a species released from the decomposed precursor; establishing a steep temperature gradient (preferably >1000° C. per meter) that extends away from the substrate surface towards an inlet for the precursor; and introducing precursor through the relatively cool inlet and across the temperature gradient towards the substrate surface. The method of WO 2017/029470 may be performed using vapour phase epitaxy (VPE) systems and metal-organic chemical vapour deposition (MOCVD) reactors.

The method of WO 2017/029470 provides two-dimensional materials with a number of advantageous characteristics including: very good crystal quality; large material grain size; minimal material defects; large sheet size; and are self-supporting. However, there remains a need for fast and low-cost processing methods for fabricating devices with complex structures from the two-dimensional materials.

2D materials, vol. 2, 2015, 045003, Mackenzie et al., "Fabrication of CVD graphene-based devices via laser ablation for wafer-scale characterization" pages 2-6 discloses selective laser ablation of a wafer-scale graphene film for fabricating devices. Journal of Laser Applications, vol. 28, 2016, 022202, Dong and Sparkes, "Evaluating femtosecond laser ablation of graphene on $SiO_2$/Si substrate" discloses micropatterning of graphene. Both of these literature references refer to pre-formed graphene layers placed onto silicon dioxide substrates. The graphene is not integrally formed on the substrate, and hence not physically or chemically bonded to the substrate surface which has a significant impact on laser interaction with graphene.

GB 2570124 discloses a method of making graphene structures and devices which comprises using a laser to selectively ablate graphene from a substrate having a thermal resistance equal to or greater than that of sapphire.

GB 2570128 discloses a method of making a graphene transistor and devices, the transistor comprising a plurality of graphene layers and having three doped regions. One method of making the transistor comprises using a laser to selectively ablate one or more portions of doped graphene from a substrate and growing a replacement portion of graphene having opposite doping.

It is an object of the present invention to provide an improved method for producing an electronic device comprising a graphene layer structure which overcomes, or substantially reduces, problems associated with the prior art or at least provides a commercially useful alternative thereto.

Accordingly, the present invention provides a method for the production of an electronic device, the method comprising:
(i) providing a substrate comprising first and second layers on a heated susceptor in a reaction chamber, the chamber having a plurality of cooled inlets arranged so that, in use, the inlets are distributed across the substrate and have a constant separation from the substrate,
(ii) supplying a flow comprising a precursor compound through the inlets and into the reaction chamber to thereby decompose the precursor compound and form a graphene layer structure on a surface of the first layer of the substrate, wherein the inlets are cooled to less than 100° C. and the susceptor is heated to a temperature of at least 50° C. in excess of a decomposition temperature of the precursor,
(iii) selectively laser ablating the graphene to expose one or more portions of the surface of the first layer of the substrate, and
(iv) selectively laser ablating the surface of the first layer of the substrate to expose one or more portions of the second layer of the substrate,
wherein the first layer is an electrically conductive layer and the second layer is an electrically insulative layer, or wherein the second layer is an electrically conductive layer and the first layer is an electrically insulative layer.

The present disclosure will now be described further. In the following passages, different aspects/embodiments of the disclosure are defined in more detail. Each aspect/embodiment so defined may be combined with any other aspect/embodiment or aspects/embodiments unless clearly indicated to the contrary. In particular, any feature indicated as being preferred or advantageous may be combined with any other feature or features indicated as being preferred or advantageous.

The present invention provides a method for the production of an electronic device. Electronic devices are well known in the art and include LEDs, photovoltaic cells, Hall sensors, Diodes and the like.

The method comprises several steps. The first and second steps represent the formation of a graphene layer by MOCVD or VPE on a substrate. MOCVD has a number of advantages for the production of large graphene layers on substrates as discussed below.

The substrate comprises first and second layers. The first layer is an electrically conductive layer and the second layer is an electrically insulative layer, or the second layer is an electrically conductive layer and the first layer is an electrically insulative layer. The method comprises a first step of providing the substrate which comprises these first and second layers. The electrical conductivity of a material can be measured by well-known techniques in the art. "Electrically conductive" is a well-known term of art and as used herein, and at least refers to an electrical conductivity of $10^{-1}$ S/cm or greater (measured at 20° C.) thereby encompassing low conductivity semiconductors. Electrical conductivity of $10^2$ S/cm or greater encompasses highly electrically conductive materials. A preferred range of electrically conductive is from $10^{-10}$ S/cm to $10^2$ S/cm. "Electrically insulative" is also a well-known term of art and as used herein at least refers to an electrical conductivity of $10^{-2}$ S/cm or less. Preferably the conductivity for electrically insulative materials is less than $10^{-5}$ S/cm, preferably less than $10^{-10}$ S/cm. Preferably an electrically insulative material has essentially no electrically conductive properties.

The substrate may consist of the electrically conductive layer and the insulative layer. By "consist", this means that the substrate only includes the electrically conductive layer and the insulative layer and does not have any other layers.

Alternatively, the present invention may be employed with a plurality of electrically conductive layers and/or a plurality of electrically insulative layers. The plurality of electrically conductive and plurality of electrically insulative layers may be arranged in a regular pattern, for example, such that each electrically conductive layer is between two electrically insulative layers. Alternatively, the electrically conductive and plurality of electrically insulative layers may be arranged in an irregular pattern.

The present invention may also be employed with one or more additional layers, such as a support layer.

Generally, it is preferred to have a substrate that is as thin as possible to ensure thermal uniformity across the substrate during graphene production. Preferred thicknesses of the first electrically conductive layer and/or second insulative layer are from 1 nm to 600 μm, preferably 1 nm to 5 μm, more preferably 1 nm to 100 nm. The total thickness of the substrate is typically 50 to 300 μm, preferably 100 μm to 200 μm and more preferably about 150 μm. However, thicker substrates would also work and thick silicon wafers are up to 2 mm thick. The minimum thickness of the substrate is however determined in part by the substrate's mechanical properties and the maximum temperature at which the substrate is to be heated. The maximum area of the substrate is dictated by the size of the close coupled reaction chamber. Preferably, the substrate has a diameter of at least 6 inches (15 cm), preferably 6 to 24 inches (15 to 61 cm) and more preferably 6 to 12 inches (15 to 30 cm). The substrate can be cut after growth to form individual devices using any known method.

Preferably, the electrically conductive layer comprises silicon or silicon carbide. Other suitable materials for the electrically conductive layer may include nitride semiconductor materials (GaN, InGaN and complexes of) and arsenide/phosphide semiconductors (GaAs, InP, and complexes of) that are compensation doped to have an electrical conductivity of $10^{-1}$ S/cm or more.

Preferably, the electrically insulative layer comprises $SiO_2$, sapphire or diamond. Other suitable materials for the second electrically insulative layer may include silicon, nitride semiconductor materials (AlN, GaN, AlGaN, and complexes of) and arsenide/phosphide semiconductors (GaAs, InP, and complexes of) that are compensation doped to have an electrical conductivity of $10^{-2}$ S/cm or less.

The inventors have found that use of such layers in the substrates having reasonably high thermal resistance allows the graphene layer to be ablated without damage to the underlying substrate.

It is preferred that the substrate provides a crystalline surface upon which the graphene is produced as ordered crystal lattice sites provide a regular array of nucleation sites that promote the formation of good graphene crystal overgrowth. The most preferred substrates provide a high density of nucleation sites. The regular repeatable crystal lattice of substrates used for semiconductor deposition is ideal, the atomic stepped surface offering diffusion barriers.

The method further comprises selectively laser ablating the graphene to expose one or more portions of the surface of the first layer of the substrate. Suitable lasers are those having wavelength in excess of 600 nm and a power of less than 50 Watts. Preferably, the first laser has a wavelength of from 700 to 1500 nm. Preferably, the first laser has a power of from 1 to 20 Watts. This allows the graphene to be readily removed without damaging the neighbouring graphene or the substrate.

The inventors have surprisingly found that $CO_2$ lasers and other lasers working at similar wavelengths are particularly suitable for selectively ablating the graphene from the substrate. Suitable lasers are those having wavelength in excess of 8 μm, preferably from 9 to 15 μm and most preferably from 9.4 to 10.6 μm and a power of from 5 to less than 50 Watts, preferably from 10 to 45 Watts, most preferably from 12 to 20 Watts. The inventors have surprisingly found that the graphene does not readily absorb the energy at this frequency and therefore less damage to the graphene occurs, even at higher power. This means that the ablation can be performed more quickly and can be used to etch away at least a portion of the surface of the substrate, preferably to a depth of 1 nm to 300 nm. As discussed above, the surface of the substrate may be formed by an electrically conductive layer or an electrically insulative layer.

The ability to etch the surface of the substrate facilitates removal of the graphene layer structure from the substrate. Without wishing to be bound by theory, it is believed that this exposes edges of the graphene sheet which can then be more readily removed. Techniques for separating the graphene from the substrate are known in the art and include cavitation techniques (such as ultrasound) and solution etching (such as with semiconductor cleaning solutions including RCA1).

Preferably the laser spot size is kept as small as possible (i.e. have a better resolution). For example, the present inventors have worked at a spot size of 25 microns. Focus should be as precise as possible. It has also been found that it is better to pulse the laser as opposed to continuous lasing, in order to prevent substrate damage.

The method further comprises selectively laser ablating the surface of the first layer of the substrate to expose one or more portions of the second layer of the substrate. The second laser may optionally be the same as the first laser. Therefore, the entirety of the above discussion concerning the first laser equally applies to the second laser.

If the surface of the substrate is the electrically conductive layer, then a second laser is used to selectively ablate one or more portions of the exposed electrically conductive layer. The ablation may extend through the thickness of the first electrically conductive layer such that corresponding portions of the electrically insulative layer are exposed.

Similarly, if the surface of the substrate is the electrically insulative layer, then a second laser is used to selectively ablate one or more portions of the exposed electrically insulative layer. The ablation may extend through the thickness of the electrically insulative layer such that corresponding portions of the electrically conductive layer are exposed.

If the surface of the substrate is the electrically conductive layer, then the electrically conductive layer is arranged between the graphene layer structure and the electrically insulative layer. The method may further comprise a step of using a laser to selectively ablate one or more portions of the electrically conductive layer to expose corresponding portions of a further electrically insulative layer. The laser employed to ablate the electrically conductive layer may or may not be the same laser as that employed to ablate the graphene layer structure.

Preferably in the step (iii) of selectively laser ablating the graphene to expose one or more portions of the surface of the first layer of the substrate, at least a portion of the first layer is also ablated, but the surface of the second layer of the substrate is not exposed.

Preferably the substrate further comprises a third layer, adjacent the second layer, and wherein the method further comprises: (v) selectively laser ablating the surface of the second layer of the substrate to expose one or more portions of the third layer of the substrate.

Preferably in the step (iv) of selectively laser ablating the graphene to expose one or more portions of the surface of the second layer of the substrate, at least a portion of the second layer is also ablated.

Preferably the method is for the production of a Hall sensor, wherein in the step (iii) of selectively laser ablating the graphene a Hall-sensor portion of the graphene is formed and, wherein the step (iv) of selectively laser ablating the surface of the first layer of the substrate forms conductive traces on the substrate. The Hall-sensor portion is therefore formed entirely out of graphene with all of the associated advantages of graphene's electrical properties. The conductive traces are therefore formed, preferably entirely, out of the first electrically conductive layer and enable connection of the Hall-sensor portion to other electronic components to complete the Hall sensor device.

A Hall sensor (Hall effect sensor) is a well-known component in the art. It is a transducer that varies its output voltage in response to a magnetic field. Hall sensors are used for proximity switching, positioning, speed detection, and current sensing applications. In a Hall sensor a thin strip of a conductor has a current applied along it, in the presence of a magnetic field the electrons are deflected towards one edge of the conductor strip, producing a voltage gradient across the short-side of the strip (perpendicular to the feed current). In contrast to inductive sensors, Hall sensors have the advantage that they can detect static (non-changing) magnetic fields.

Preferably the method is for use in the provision of a plurality of Hall-sensor portions on the substrate. This would allow multiple detectors on the same substrate, or for the substrate to then be divided by conventional means into a plurality of sensors.

Preferably the method further comprising applying contacts to a surface of the graphene layer structure. This allows for the formation of an electrical circuit.

According to another aspect there is provided an integrated circuit board comprising a graphene component and conductive traces obtainable by the method described herein. Since the layers are integrally formed together, it is possible to distinguish a board produced according to the present method from one involving subsequent attachment or adhesion of the layers together. The component is formed out of graphene, with all of the associated advantages of graphene's electrical properties. The conductive traces are formed entirely out of the first electrically conductive layer and enable connection of the graphene component to other electronic components.

The inventors have found that if graphene is grown using the method described herein it may be efficiently and effectively laser etched to produce graphene structures having complex defined geometry. By forming specific devices on the substrate out of a continuous graphene layer, the specific devices may be formed entirely out of graphene with all of the associated advantages of graphene's electrical properties. According to the method described herein, the electrically conductive layer and/or electrically insulative layer may be effectively etched to produce non-graphene, electrically conductive traces/circuitry that are formed entirely out of the first electrically conductive layer. Indeed, the inventors have found that using the method described herein they can make a plurality of Hall sensors in a single piece.

Accordingly, the method of the invention enables electronic devices having graphene components with non-graphene, electrically conductive traces/circuitry to be produced with minimal machining and processing. Furthermore, according to the method of the invention, the electronic device and traces/circuitry may be patterned on the entire substrate and that substrate can then be cut through conventional means to form multiple individual chips or devices. Following the method of the claimed invention there is no requirement for photolithography. Accordingly, the method of the invention enables production of electronic devices without process contaminants, etching fluids or solvents. Therefore, the method of the invention provides an environmentally friendly, quick and cheap process for manufacturing complex devices.

In another embodiment, as described above, the first layer may be electrically insulative and the second layer be electrically conductive. Once the first layer has been ablated in a region, a contact material may be deposited to bridge between the graphene and the electrically conductive second layer to establish electrical communication. In this way an electrically isolated graphene device on top of the first layer may be connected to a circuit via the contact material to the second electrically conductive layer. Suitable contact materials, such as deposited metal-containing compositions, as well known in the art.

The graphene layer structures disclosed herein may have from 1 to 100 graphene layers, preferably 1 to 40 graphene layers, more preferably 1 to 10 graphene layers. The more layers present, the better the electrical properties observed. Graphene is a well-known term in the art and refers to an allotrope of carbon comprising a single layer of carbon atoms in a hexagonal lattice. The term graphene used herein encompasses structures comprising multiple graphene layers stacked on top of each other. The term graphene layer is used herein to refer to a graphene monolayer. Said graphene monolayers may be doped or undoped. The graphene layer structures disclosed herein are distinct from graphite since the layer structures retain graphene-like properties.

The method involves the steps of:
(i) providing a substrate comprising first and second layers on a heated susceptor in a reaction chamber, the chamber having a plurality of cooled inlets arranged so that, in use, the inlets are distributed across the substrate and have a constant separation from the substrate,
(ii) supplying a flow comprising a precursor compound through the inlets and into the reaction chamber to thereby decompose the precursor compound and form a graphene layer structure on a surface of the first layer of the substrate, wherein the inlets are cooled to less than 100° C. and the susceptor is heated to a temperature of at least 50° C. in excess of a decomposition temperature of the precursor.

These steps involve the substrate being formed by MOCVD or VPE. MOCVD is a term used to describe a system used for a particular method for the deposition of layers on a substrate. While the acronym stands for metal-organic chemical vapour deposition, MOCVD is a term in the art and would be understood to relate to the general process and the apparatus used therefor and would not necessarily be considered to be restricted to the use of metal-organic reactants or to the production of metal-organic materials. Instead, the use of this term indicates to the person skilled in the art a general set of process and apparatus features. MOCVD is further distinct from CVD techniques by virtue of the system complexity and accuracy. While CVD techniques allow reactions to be performed with straight-forward stoichiometry and structures, MOCVD allows the production of difficult stoichiometries and structures. An MOCVD system is distinct from a CVD system by virtue of at least the gas distribution systems, heating and temperature control systems and chemical control systems. An MOCVD system typically costs at least 10 times as much as a typical CVD system. CVD techniques cannot be used to achieve high quality graphene layer structures. MOCVD can also be readily distinguished from atomic layer deposition (ALD) techniques. ALD relies on step-wise reactions of reagents with intervening flushing steps used to remove undesirable byproducts and/or excess reagents. It does not rely on decomposition or dissociation of the reagent in the gaseous phase. It is particularly unsuitable for the use of reagents with low vapour pressures such as silanes, which would take undue time to remove from the reaction chamber.

The substrate is provided on a heated susceptor in a reaction chamber as described herein. The substrate may be arranged such that the first electrically conductive layer is provided on top of the second electrically insulative layer within the reaction chamber such that the first electrically conductive layer forms the surface of the substrate on which the graphene layer structure is formed. The term "surface of the substrate" used herein refers to the surface on which the graphene layer structure is formed. Alternatively, the substrate may be arranged such that the second electrically insulative layer is provided on top of the first electrically conductive layer within the reaction chamber such that the second electrically insulative layer forms the surface of the substrate on which the graphene layer structure is formed. Reaction chambers suitable for use in the present method are well known and include a heated susceptor capable of heating the substrate to the necessary temperatures. The susceptor may comprise a resistive heating element or other means for heating the substrate.

The chamber has a plurality of cooled inlets arranged so that, in use, the inlets are distributed across the substrate and have a constant separation from the substrate. The flow comprising a precursor compound may be provided as a horizontal laminar flow or may be provided substantially vertically. Inlets suitable for such reactors are well known and include Planetary and Showerhead reactors available from Aixtron®.

The spacing between the substrate surface upon which the graphene is formed and the wall of the reactor directly above the substrate surface has a significant effect on the reactor thermal gradient. It is preferred that the thermal gradient is as steep as possible which correlates to a preferred spacing that is as small as possible. A smaller spacing changes the boundary layer conditions at the substrate surface that in turn promotes uniformity of graphene layer formation. A smaller spacing is also highly preferred as it allows refined levels of control of the process variables, for example reduced precursor consumption through lower input flux, lower reactor and hence substrate temperature which decreases stresses and non-uniformities in the substrate leading to more uniform graphene production on the substrate surface and hence, in most cases, significantly reduced process time.

Experimentation suggests a maximum spacing of about 100 mm is suitable. However, ore reliable and better quality two-dimensional crystalline material is produced using a much smaller spacing equal to or less than about 20 mm, such as 1 to 5 mm; a spacing equal or less than about 10 mm promotes the formation of stronger thermal currents proximate the substrate surface that increase production efficiency.

Where a precursor is used that has a relative low decomposition temperature such that there is likely to be a more than negligible degree of decomposition of the precursor at the temperature of the precursor inlet, a spacing below 10 mm is strongly preferred to minimise the time taken for the precursor to reach the substrate.

During the production method, a flow is supplied comprising a precursor compound through the inlets and into the reaction chamber to thereby decompose the precursor compound and form graphene on the substrate. The flow comprising a precursor compound may further comprise a dilution gas. Suitable dilution gases are discussed in more detail below.

Preferably, the precursor compound is a hydrocarbon. Preferably a hydrocarbon which is a liquid at room temperature and most preferably a $C_5$ to $C_{10}$ alkane. The use of simple hydrocarbons is preferred since this gives a pure source of carbon with gaseous hydrogen as a by-product. In addition, since the hydrocarbons are liquid at room temperature, they can be obtained in a highly pure liquid form at low cost.

The precursor is preferably in the gas phase when passed over the heated substrate. There are two variables to be considered: pressure within the close coupled reaction chamber and the gas flow rate into the chamber.

The preferred pressure selected depends upon the precursor chosen. In general terms, where precursors of greater molecular complexity are used, improved two-dimensional crystalline material quality and rate of production is observed using lower pressures, e.g. less than 500 mbar. Theoretically, the lower the pressure the better, but the benefit provided by very low pressures (e.g. less than 200 mbar) will be offset by very slow graphene formation rates.

Conversely, for less complex molecular precursors, higher pressures are preferred. For example, where methane is used as a precursor for graphene production, a pressure of 600 mbar or greater may be suitable. Typically, it is not expected to use pressures greater than atmospheric because of its detrimental impact on substrate surface kinetics and the mechanical stresses placed on the system. A suitable pressure can be selected for any precursor through simple empirical experimentation, which may involve for example, five test runs using respective pressures of 50 mbar, 950 mbar and three others of equidistance intervals between the first two. Further runs to narrow the most suitable range can then be conducted at pressures within the interval identified in the first runs as being most suitable. The preferred pressure for hexane is from 50 to 800 mbar.

The precursor flow rate can be used to control the graphene deposition rate. The flow rate chosen will depend upon the amount of the species within the precursor and the area of the layer to be produced. Precursor gas flow rate needs to be high enough to allow coherent graphene layer formation on the substrate surface. If the flow is above an upper threshold rate, bulk material formation, e.g. graphite, will generally result or increased gas phase reactions will occur resulting in solid particulates suspended in the gas phase that are detrimental to graphene formation and/or may contaminate the graphene layer. The minimum threshold flow rate can be theoretically calculated using techniques known to the person skilled in the art, by assessing the amount of the species required to be supplied to the substrate to ensure sufficient atomic concentrations are available at the substrate surface for a layer to form. Between the minimum and upper threshold rates, for a given pressure and temperature, flow rate and graphene layer growth rate are linearly related.

Preferably, a mixture of the precursor with a dilution gas is passed over the heated substrate within a close coupled reaction chamber. The use of a dilution gas allows further refinement of the control of the carbon supply rate.

It is preferred that the dilution gas includes one or more of hydrogen, nitrogen, argon and helium. These gases are selected because they will not readily react with a large number of available precursors under typical reactor conditions, nor be included in the graphene layer. Notwithstanding, hydrogen may react with certain precursors. Additionally, nitrogen can be incorporated into the graphene layer under certain conditions. In such instances one of the other dilution gases can be used.

In spite of these potential problems, hydrogen and nitrogen are particularly preferred because they are standard gases used in MOCVD and VPE systems.

The susceptor is heated to a temperature of at least 50° C. in excess of a decomposition temperature of the precursor, more preferably from 100 to 200° C. in excess. The preferred temperature to which the substrate is heated is dependent upon the precursor selected. The temperature selected needs to be high enough to allow at least partial decomposition of the precursor in order to release the species, but preferably not so high as to promote increased recombination rates in the gas phase away from the substrate surface and hence production of unwanted by-products. The selected temperature is higher than the complete decomposition temperature to promote improved substrate surface kinetics and so encourage formation of graphene with good crystal quality. For hexane, the most preferred temperature is about 1200° C., such as from 1150 to 1250° C.

In order for there to be a thermal gradient between the substrate surface and the introduction point for precursor, the inlet will need to be of a lower temperature than the substrate. For a fixed separation, a greater temperature difference will provide a steeper temperature gradient. As such it is preferred that at least the wall of the chamber through which the precursor is introduced, and more preferably the walls of the chamber are cooled. Cooling may be achieved using a cooling system, for example, using fluid, preferably liquid, most preferably water, cooling. The reactor's walls may be maintained at constant temperature by water cooling. The cooling fluid may flow around the inlet(s) to ensure that the temperature of the inner surface of the reactor wall through which the inlets extend, and thus of the precursor itself as it passes through the inlet and into the reaction chamber, is substantially lower than the substrate temperature. The inlets are cooled to less than 100° C., preferably 50 to 60° C.

For some embodiments it may be desirable to dope the graphene. This may be achieved by introducing a doping element into the close coupled reaction chamber and selecting a temperature of the substrate, a pressure of the reaction chamber and a gas flow rate to produce a doped graphene. Straightforward empirical experimentation can be used to determine these variables using the guidance described above. This process can be used with or without a dilution gas.

There is no perceived restriction as to doping element that may be introduced. Commonly used dopant elements for the production of graphene include silicon, magnesium, zinc, arsenic, oxygen, boron, bromine and nitrogen.

Elements of the above-described method will now be discussed in more detail.

A close coupled reaction chamber provides a separation between the substrate surface upon which the graphene is formed and the entry point at which the precursor enters the close coupled reaction chamber that is sufficiently small that the fraction of precursor that reacts in the gas phase within the close coupled reaction chamber is low enough to allow the formation of graphene. The upper limit of the separation may vary depending upon the precursor chosen, substrate temperate and pressure within the close coupled reaction chamber.

Compared with the chamber of a standard CVD system, the use of a close coupled reaction chamber, which provides the aforementioned separation distance, allows a high degree of control over the supply of the precursor to the substrate; the small distance provided between the substrate surface on which the graphene is formed and the inlet through which the precursor enters the close coupled reaction chamber, allows for a steep thermal gradient thereby providing a high degree of control over the decomposition of the precursor.

The relatively small separation between the substrate surface and the chamber wall provided by a close coupled reaction chamber, compared with the relatively large separation provided by a standard CVD system allows:

1) a steep thermal gradient between the precursor's entry point and the substrate surface;

2) a short flow path between the precursor entry point and the substrate surface; and 3) a close proximity of the precursor entry point and the point of graphene formation.

These benefits enhance the effects that deposition parameters including substrate surface temperature, chamber pressure and precursor flux have on the degree of control over the delivery rate of the precursor to the substrate surface and the flow dynamics across the substrate surface.

These benefits and the greater control provided by these benefits enable minimisation of gas phase reactions within the chamber, which are detrimental graphene deposition; allow a high degree of flexibility in the precursor decomposition rate, enabling efficient delivery of the species to the substrate surface; and gives control over the atomic configuration at the substrate surface which is impossible with standard CVD techniques.

Through both simultaneously heating the substrate and providing cooling to the wall of the reactor directly opposite the substrate surface at the inlet, a steep thermal gradient can be formed whereby the temperature is a maximum at the substrate surface and drops rapidly towards the inlet. This ensures the reactor volume above the substrate surface has a significantly lower temperature than the substrate surface itself, largely reducing the probability of precursor reaction, in the gas phase, until the precursor is proximate the substrate surface.

An alternative design of MOCVD reactor is also contemplated which has been demonstrated to be efficient for graphene growth as described herein. This alternative design is a so-called High Rotation Rate (HRR) or "Vortex" flow system. Whereas the close-coupled reactor described above focussed on creating graphene using a very high thermal gradient, the new reactor has a significantly wider spacing between the injection point and growth surface or substrate. Close coupling allowed extremely rapid dissociation of precursors delivering elemental carbon, and potentially other doping elements, to the substrate surface allowing the formation of graphene layers. In contrast, the new design relies on a vortex of the precursors.

In the new reactor design, in order to promote laminar flow over the surface this system utilizes a higher rotation rate to impinge a high level of centrifugal acceleration on the injected gas stream. This results in a vortex type fluid flow within the chamber. The effect of this flow pattern is a significantly higher residency time of the precursor molecules proximate to the growth/substrate surface compared to other reactor types. For the deposition of graphene this increased time is what promotes the formation of elemental layers.

However, this type of reactor does have a couple of parasitic issues, firstly the amount of precursor required to achieve the same amount of growth as other reactors increases due to the reduced mean free path that this flow regime causes, resulting in more collisions of precursor molecules delivering non-graphene growth atomic recombination. However, the use of reagents such as hexane which are relatively cheap means that this problem can be readily overcome. Additionally, the centrifugal motion has varying impacts on atoms and molecules of different sizes resulting in the ejection of different elements at different velocities. While this probably assists graphene growth due to the uniform rate of carbon supply with ejection of unwanted precursor by-products it can be detrimental to desired effects such as elemental doping. It is therefore preferred to use this design of reactor for undoped graphene, such as is desirably used for Hall sensors or filters as described herein.

An example of such a reaction system is the Veeco Instruments Inc. Turbodisc technology, K455i or Propel tools.

Preferably the reactor used herein is a high rotation rate reactor. This alternative design of reactor may be characterised by its increased spacing and high rotation rate. Preferred spacings are from 50 to 120 mm, more preferably 70 to 100 mm. The rotation rate is preferably from 100 rpm to 3000 rpm, preferably 1000 rpm to 1500 rpm.

In a preferred embodiment, the method comprises:
(i) providing a substrate comprising a layer of silicon (electrically conductive layer) and a layer of silicon dioxide (electrically insulative layer), on a heated susceptor in a reaction chamber, the chamber having a plurality of cooled inlets arranged so that, in use, the inlets are distributed across the substrate and have a constant separation from the substrate,
(ii) supplying a flow comprising a precursor compound through the inlets and into the reaction chamber to thereby decompose the precursor compound and form a graphene layer structure on a surface of the substrate, wherein the inlets are cooled to less than 100° C. and the susceptor is heated to a temperature of at least 50° C. in excess of a decomposition temperature of the precursor,
(iii) selectively laser ablating the graphene to expose one or more portions of the surface of the silicon layer of the substrate, and
(iv) selectively laser ablating the surface of the silicon layer of the substrate to expose one or more portions of the silicon dioxide layer of the substrate.

FIGURES

The present invention will now be described further with reference to the following non-limiting Figures, in which.

Figure 1:
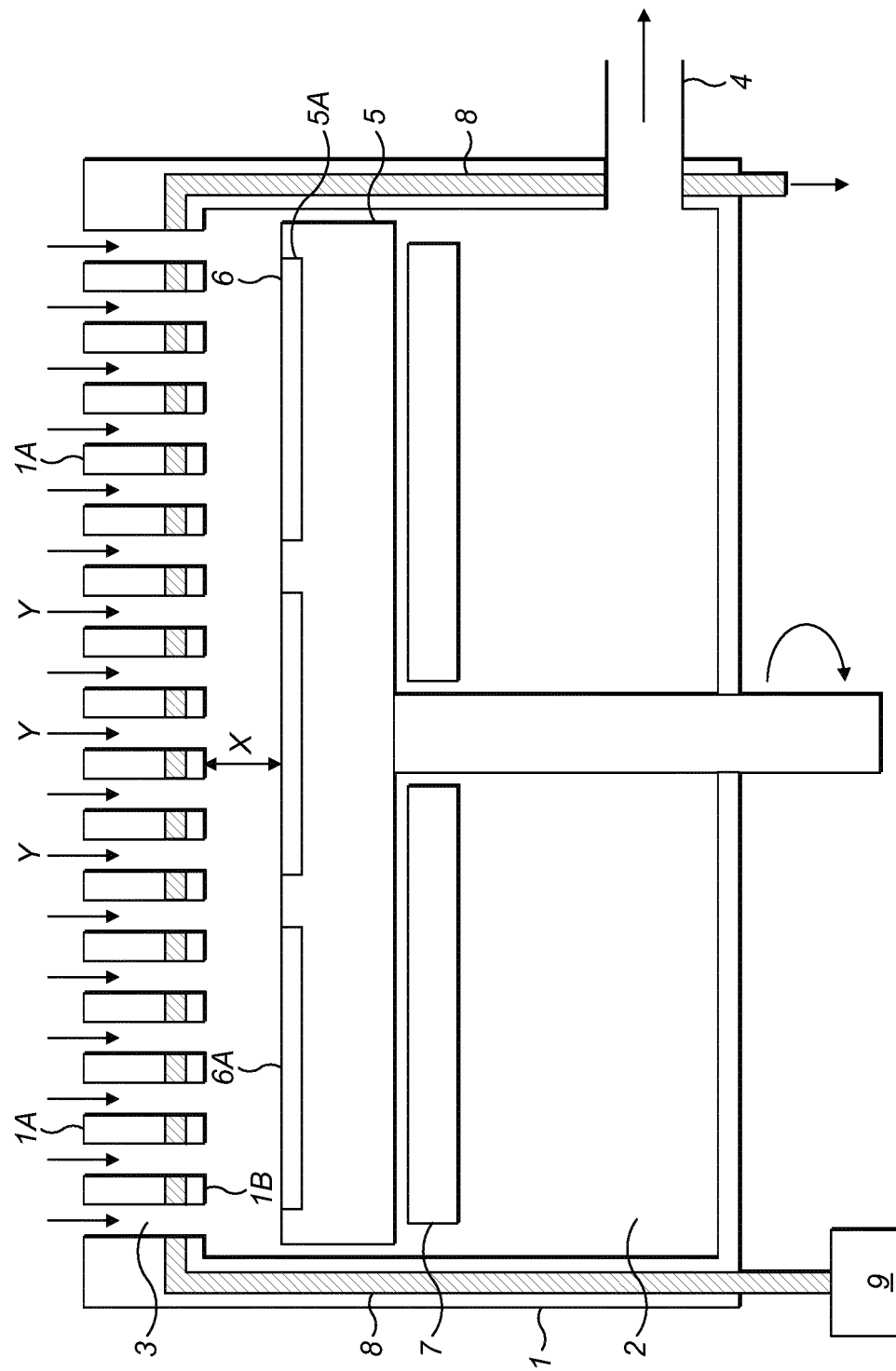
FIG. 1 shows a schematic cross-section of a graphene-layer growth chamber for use in the method described herein.

The reactor of FIG. 1 is constructed for the deposition of a graphene layer on a substrate through the method of MOCVD (albeit without a metal organic reagent), in which a precursor is introduced to thermally, chemically and physically interact in the vicinity of and on the substrate to form a graphene layer structure having from 1 to 40 graphene layers, preferably 1 to 10 graphene layers.

The apparatus comprises a close coupled reactor 1 having a chamber 2 having inlets 3 provided through a wall 1A and at least one exhaust 4. A susceptor 5 is arranged to reside within the chamber 2. The susceptor 5 comprises one or more recesses 5A for retaining one or more substrates 6. The apparatus further comprises means to rotate the susceptor 5 within the chamber 2; and a heater 7, e.g. comprising a resistive heating element, or RF induction coil, coupled to the susceptor 5 to heat the substrate 6. The heater 7 may comprise a single or multiple elements as required to achieve good thermal uniformity of the substrate 6. One or more sensors (not shown) within the chamber 2 are used, in conjunction with a controller (not shown) to control the temperature of the substrate 6.

The temperature of the walls of the reactor 1 are maintained at a substantially constant temperature by water cooling.

The reactor walls define one or more internal channels and/or a plenum 8 that extend substantially adjacent (typically a couple of millimetres away) the inner surface of reactor walls including inner surface 1B of wall 1A. During operation, water is pumped by a pump 9 through the channels/plenum 8 to maintain the inside surface 1B of wall 1A at or below 200° C. In part because of the relatively narrow diameter of the inlets 3, the temperature of the precursor (which is typically stored at a temperature much below the temperature of inside surface 1B), as it passes through inlets 3 through wall 1A into the chamber 1 will be substantially the same or lower than the temperature of the inside surface 1B of wall 1A. The inlets 3 are arranged in an array over an area that is substantially equal or greater than the area of the one or more substrates 6 to provide substantially uniform volumetric flow over substantially the entirety of surfaces 6A of the one or more substrates 6 that face the inlets 3.

The pressure within the chamber 2 is controlled through control of precursor gas flows through inlet(s) 3 and exhaust gas through exhaust 4. Via this methodology, the velocity of the gas in the chamber 2 and across the substrate surface 6A and further the mean free path of molecules from the inlet 3 to substrate surface 6A are controlled. Where a dilution gas is used, control of this may also be used to control pressure through inlet(s) 3. The precursor gas is preferably hexane.

The susceptor 5 is comprised from a material resistant to the temperatures required for deposition, the precursors and dilution gases. The susceptor 5 is usually constructed of uniformly thermally conducting materials ensuring substrates 6 are heated uniformly. Examples of suitable susceptor material include graphite, silicon carbide or a combination of the two.

The substrate(s) 6 are supported by the susceptor 5 within the chamber 2 such that they face wall 1A with a separation, denoted in FIG. 1 by Y, of between 1 mm-100 mm, though, as discussed above, generally the smaller the better. Where the inlets 3 protrude into or otherwise sit within the chamber 2, the relevant separation is measured between the substrate(s) 6 and exit of the inlets 3.

The spacing between the substrate 6 and the inlets 3 may be varied by moving the susceptor 5, substrate 6 & heater 7.

An example of a suitable close coupled reactor is the AIXTRON® CRIUS MOCVD reactor, or AIXTRON® R&D CCS system.

Precursors in gaseous form or in molecular form suspended in a gas stream are introduced (represented by arrows Y) into the chamber 2 through inlets 3 such that they will impinge on or flow over the substrate surface 6A. Precursors that may react with one another are kept separated until entering the chamber 2 by introduction through different inlets 3. The precursor or gas flux/flow rate is controlled externally to the chamber 2 via a flow controller (not shown), such as a gas mass flow controller.

A dilution gas may be introduced through an inlet or inlets 3 to modify gas dynamics, molecular concentration and flow velocity in the chamber 2. The dilution gas is usually selected with respect to the process or substrate 6 material such that it will not have an impact on the growth process of the graphene layer structure. Common dilution gases include Nitrogen, Hydrogen, Argon and to a lesser extent Helium.

After the graphene layer structure has been formed, the reactor is then allowed to cool and the substrate 6 is retrieved having the graphene layer structure thereon. The graphene layer structure typically has from 1 to 40 graphene layers, preferably 1 to 10 graphene layers. The substrate 6 is then registered within a laser ablation rig comprising a first laser, for example, a HeNe laser having a wavelength of 1152 nm and a strength of 10 W or a $CO_2$ laser having a wavelength of 10.6 µm and a strength of 45 Watts.

The first laser was used to ablate graphene from the substrate to expose the surface substrate and to define a graphene component of an electronic device.

Once graphene has been ablated from the substrate, a second laser of the laser ablation rig is used to ablate one or more portions of the exposed surface of the substrate. The second laser is therefore used to define traces/circuitry formed of the first electrically conductive layer. The surface of the substrate having the graphene thereon may be the electrically conductive layer or the electrically insulative layer.

Preferably the graphene is formed on the electrically conductive layer, so that the further ablation of the electrically conductive layer provides isolated electrical traces extending away from the graphene components into a wider circuit. Alternative, the graphene may be formed on an electrically insulating layer and subsequently connected to exposed portions of the electrically conducting layer by metal deposition. It should be appreciated that the underlying second layer, when electrically conductive may be shaped in the form of an electrical circuit, such that specific contact connection points are exposed by the laser ablation.

The second laser may be the same as the first laser and so may be, for example, a HeNe laser having a wavelength of 1152 nm and a strength of 10 W or a $CO_2$ laser having a wavelength of 10.6 µm and a strength of 45 Watts.

Figure 2:
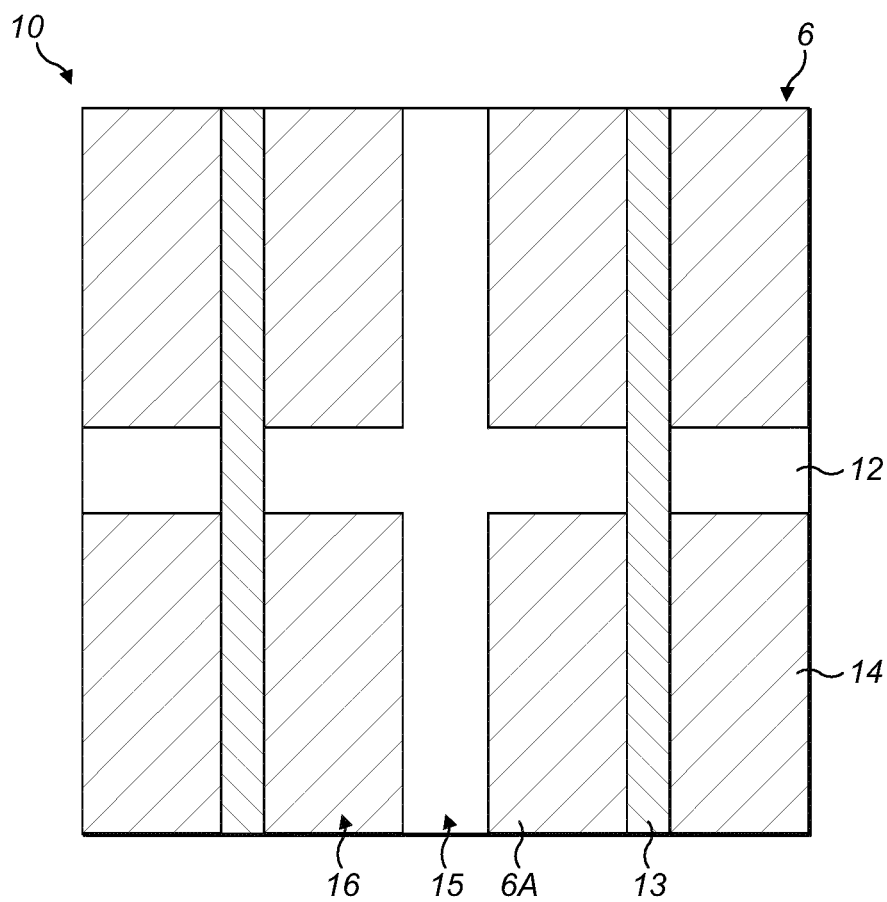
FIG. 2 shows a schematic plan view of a first electronic device produced in accordance with the method of the disclosure.
Figure 3:
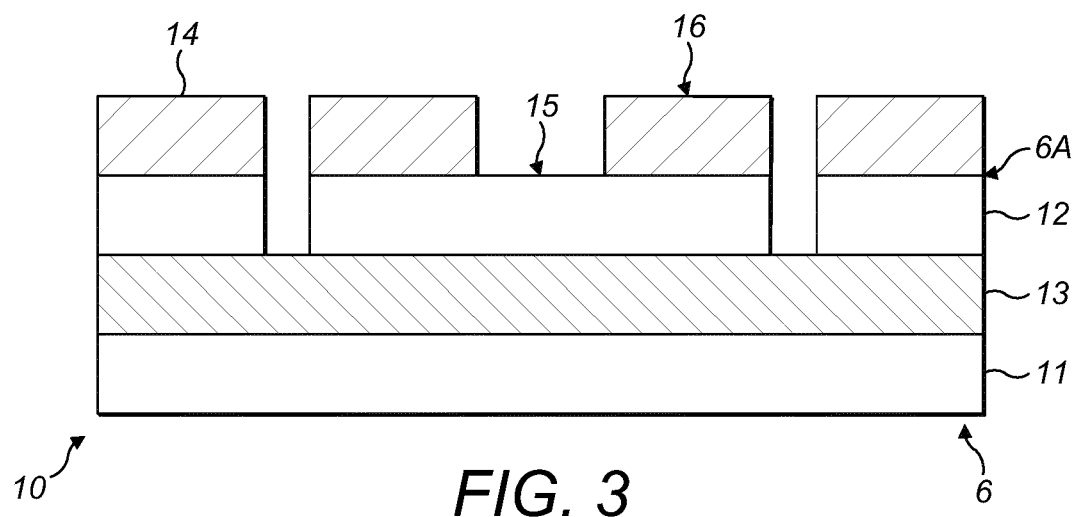
FIG. 3 shows a schematic end view of the first electronic device.

An example resulting electronic device 10 is shown in FIGS. 2 and 3.

As shown in FIGS. 2 and 3, the electronic device 10 has a substrate 6. The substrate 6 comprises a support 11, a first electronically conductive layer 12 and a second electronically insulative layer 13 therebetween. Therefore, in this example, the surface 6A of the substrate 6 is the first electronically conductive layer 12. A graphene layer structure 14 has been formed on the surface 6A using the reactor 1 and method discussed above.

As can be seen in FIGS. 2 and 3, some of the graphene layer structure 14 has been ablated to expose areas of the surface 6A of the substrate 6. Some of the exposed surface of the substrate 6, which is formed of the first electrically conductive layer 12, has then been ablated to expose corresponding portions of the second electronically insulative layer 13. Accordingly, an electronic device having traces 15 formed of the first electrically conductive layer and a graphene component 16 has been produced.

EXAMPLES

The present invention will now be described further with reference to the following non-limiting examples.

The following describes example processes using the aforementioned apparatus that successfully produced graphene layer structure having from 1 to 40 graphene layers, preferably 1 to 10 graphene layers. In all examples a close coupled vertical reactor of diameter 250 mm with six 2" (50 mm) target substrates were used. For reactors of alternate dimensions and/or different target substrate areas, the precursor and gas flow rates can be scaled through theoretical calculation and/or empirical experimentation to achieve the same results.

Using the method of the invention it has been possible to produce patterned graphene with substantially improved properties over known methods, for example with a grain size greater than 20 µm, covering a substrate of 6 inch diameter with 98% coverage, a layer uniformity of >95% of the substrate, sheet resistivity less than 450 Q/sq and electron mobility greater than 2435 $cm^2$/Vs. The most recent tests on a graphene layer produced using the method of the invention have demonstrated electron mobility>8000 $cm^2$/V s across the full layer tested at standard conditions for temperature and pressure. The method has been able to produce graphene layers across a substrate of 6 inches (15 cm) having undetectable discontinuity, measured by standard Raman and AFM mapping techniques to micron scale. The method has also shown to be able to produce a uniform graphene monolayer and stacked uniform graphene layers across the substrate without formation of additional layer fragments, individual carbon atoms or groups of carbon atoms on top of the or uppermost uniform monolayer.

The following description details how to create one monolayer of graphene on a substrate having a first electrically conductive layer and a second electrically insulative layer, using the process of Metal Organic Chemical Vapour Deposition (MOCVD), delivering high quality, high mobility material suitable for electronics.

I. A substrate having wafer(s) of silicon as the first electrically conductive layer and wafer(s) of silicon dioxide as the second electrically insulative layer is loaded into the MOCVD reactor chamber such that the first electrically conductive layer arranged on top of the second electrically insulative layer. Accordingly, the first electrically conductive layer is the substrate surface.

II. The reactor is closed which results in the gas injectors being located 10-11 mm above the substrate surface.

III. The reactor chamber pump-purge cycled to remove any presence of the ambient environment.

IV. A gas flow of 10 slm of hydrogen is introduced to the reactor and remains on constantly.

V. The reactor pressure is reduced to 50 mbar.
VI. The reactor temperature (i.e. the susceptor) and by association the wafer(s) are heated up to 1050° C.
VII. The temperature is allowed to stabilise for 3 minutes after reaching the set-point.
VIII. Hexane is introduced to the reactor chamber via gas stream pick up from a liquid source at a flow of 0.1 slm for a period of 2 minutes. This allows a graphene 'nucleation' structure to be formed on the substrate surface.
IX. The hexane flow is turned off.
X. The wafer temperature is increased to 1350° C.
XI. The temperature is allowed to stabilise for 3 minutes after reaching the set-point.
XII. Hexane is reintroduced to the reactor chamber, again via gas stream pick up from a liquid source, this time at a flow of 0.2 slm for 8 minutes.
XIII. The hexane flow is turned off to the reactor chamber
XIV. The reactor is cooled to room temperature in 15 minutes, with hydrogen still flowing
XV. The reactor chamber is increased back to atmospheric pressure using nitrogen gas
XVI. The wafer(s) are now ready to be unloaded.

The above process can be varied to produce graphene with slightly varying properties, such as carrier concentration and electron mobility, by modifying some of the above variables, such as gas flow rate, Hexane flow rate, substrate temperature.

The substrate has a first electrically conductive layer of silicon and a second electrically insulative layer of silicon dioxide.

The following is a description of how to create Hall sensors (Hall-effect sensors) using the above wafer-scale graphene material. The following fabrication process uses graphene on a substrate. The substrate has a first electrically conductive layer formed of silicon and a second electrically insulative layer formed of silicon dioxide arranged such that the first electrically conductive layer is between the graphene layer structure and the second electrically insulative layer.

I. A custom-designed mask is placed over the graphene wafer leaving only the areas where electrical contacts are required exposed
II. Electrical contacts comprising of 5 nm of chromium and 70 nm of gold are deposited onto the graphene surface, through the mask using a standard metal depositing technique, such as electron-beam deposition.
III. The wafer is removed from the metal deposition system and the mask is removed from the wafer.
IV. The wafer is placed into a laser etching system. The power was about 8 W, but in there is a fairly wide window here, depending on the thermal insulative properties of the substrate.
V. The first laser is directed towards the graphene wafer and set at a power and wavelength suitable for ablating graphene from the wafer surface.
VI. The first laser is controlled such that patterns are ablated into the graphene material. These patterns form the shapes of the desired devices. The vaporisation of the graphene is controlled such that the pattern is formed around the deposited electrical contacts, without overlap. With good control this allows the formation of multiple Hall-sensor portions on a single wafer.
VII. The second laser is directed towards portions of the first electrically conductive layer exposed following ablation of the graphene wafer. The second laser is set at a power and wavelength suitable for ablating one or more portions of the first electrically conductive layer.
VIII. The second laser is controlled such that the patterns are ablated into the first electrically conductive layer. The vaporisation of the first electrically conductive layer (silicon layer) is controlled such that patterns are formed around the deposited electrical contacts, without overlap. With good control this allows the formation of conductive traces for connection of the multiple Hall-sensor portions to other electronic components to complete the Hall sensor devices.
IX. The wafer is removed from the laser patterning system delivering a number of sensors having Hall-sensor portions formed of graphene and traces formed of the first electrically conductive material (silicon).

All percentages herein are by weight unless otherwise stated.

The foregoing detailed description has been provided by way of explanation and illustration, and is not intended to limit the scope of the appended claims. Many variations in the presently preferred embodiments illustrated herein will be apparent to one of ordinary skill in the art, and remain within the scope of the appended claims and their equivalents.

The invention claimed is:

1. A method for the production of an electronic device, the method comprising:
   (i) providing a substrate comprising first and second layers on a heated susceptor in a reaction chamber, the chamber having a plurality of cooled inlets arranged so that, in use, the inlets are distributed across the substrate and have a constant separation from the substrate,
   (ii) supplying a flow comprising a precursor compound through the inlets and into the reaction chamber to thereby decompose the precursor compound and form a graphene layer structure on a surface of the first layer of the substrate, wherein the inlets are cooled to less than 100° C. and the susceptor is heated to a temperature of at least 50° C. in excess of a decomposition temperature of the precursor,
   (iii) selectively laser ablating the graphene to expose one or more portions of the surface of the first layer of the substrate, and
   (iv) selectively laser ablating the surface of the first layer of the substrate to expose one or more portions of the second layer of the substrate,
   wherein the first layer is an electrically conductive layer and the second layer is an electrically insulative layer, or wherein the second layer is an electrically conductive layer and the first layer is an electrically insulative layer.

2. The method of claim 1, wherein in the step (iii) of selectively laser ablating the graphene to expose one or more portions of the surface of the first layer of the substrate, at least a portion of the first layer is also ablated, but the surface of the second layer of the substrate is not exposed.

3. The method of claim 1, wherein the substrate further comprises a third layer, adjacent the second layer, and wherein the method further comprises:
   (v) selectively laser ablating the surface of the second layer of the substrate to expose one or more portions of the third layer of the substrate.

4. The method of claim 1, wherein in the step (iv) of selectively laser ablating the graphene to expose one or more portions of the surface of the second layer of the substrate, at least a portion of the second layer is also ablated.

5. The method according to claim 1, wherein the electrically conductive layer comprises silicon or silicon carbide.

6. The method according to claim 1, wherein the electrically conductive layer has a thickness of from 1 nm to 5 μm.

7. The method according to claim 1, wherein the electrically insulative layer comprises $SiO_2$, sapphire or diamond.

8. The method according to claim 1, wherein the substrate consists of the first and second layers, or the first, second and third layers.

9. The method of claim 1, wherein the step (iii) of selectively laser ablating the graphene is performed with a laser having a wavelength in excess of 600 nm and a power of less than 50 Watts.

10. The method according to claim 9, wherein the laser:
(a) has a wavelength of from 700 to 1500 nm; and/or
(b) has a power of from 1 to 20 Watts.

11. The method according to claim 1, wherein one or more of the selective laser ablation steps are performed with a laser which:
(a) has a wavelength of at least 8 μm, preferably from 9 to 15 μm and most preferably from 9.4 to 10.6 μm; and/or
(b) has a power of from 5 to less than 50 Watts.

12. The method according to claim 1, wherein the same laser is used in each selective laser ablation step.

13. The method according to claim 1, wherein the precursor compound is a hydrocarbon.

14. The method according to claim 1, wherein the substrate has a diameter of at least 6 inches (15 cm).

15. The method according to claim 1, for the production of a Hall sensor, wherein in the step (iii) of selectively laser ablating the graphene a Hall-sensor portion of the graphene is formed and, wherein the step (iv) of selectively laser ablating the surface of the first layer of the substrate forms conductive traces on the substrate.

16. The method according to claim 15, for use in the provision of a plurality of Hall-sensor portions on the substrate.

17. The method according to claim 1, the method further comprising applying contacts to a surface of the graphene layer structure.

18. An integrated circuit board comprising a graphene component and conductive traces obtainable by the method of claim 1.

19. The method of claim 13 wherein the precursor compound is a hydrocarbon which is a liquid at room temperature.

20. The method of claim 13 wherein the precursor is a $C_5$ to $C_{10}$ alkane.

* * * * *